United States Patent
Mueck et al.

(10) Patent No.: US 6,667,707 B2
(45) Date of Patent: Dec. 23, 2003

(54) ANALOG-TO-DIGITAL CONVERTER WITH THE ABILITY TO ASYNCHRONOUSLY SAMPLE SIGNALS WITHOUT BIAS OR REFERENCE VOLTAGE POWER CONSUMPTION

(75) Inventors: Michael Mueck, Andover, MA (US); Michael C. W. Coln, Lexington, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/136,917

(22) Filed: May 2, 2002

(65) Prior Publication Data

US 2003/0206038 A1 Nov. 6, 2003

(51) Int. Cl.[7] .................................................. H03M 1/12
(52) U.S. Cl. ........................ 341/172; 341/150; 341/155; 341/163
(58) Field of Search ................................ 341/155, 144, 341/139; 330/253, 292; 327/91

(56) References Cited

U.S. PATENT DOCUMENTS

| | | | | |
|---|---|---|---|---|
| 5,488,370 A | * | 1/1996 | Harada | 341/161 |
| 5,546,044 A | * | 8/1996 | Calligaro et al. | 327/543 |
| 6,060,914 A | * | 5/2000 | Nunokawa | 327/91 |
| 6,060,942 A | * | 5/2000 | Oh | 327/536 |
| 6,114,907 A | * | 9/2000 | Sakurai | 330/253 |
| 6,166,671 A | * | 12/2000 | Kitagawa et al. | 341/139 |
| 6,353,361 B1 | * | 3/2002 | Sun | 330/253 |
| 6,369,729 B1 | * | 4/2002 | Srinivasan et al. | 341/143 |

OTHER PUBLICATIONS

Sarraj, US 2002/0000924, Jan. 3, 2002.*

* cited by examiner

*Primary Examiner*—Peguy JeanPierre
(74) *Attorney, Agent, or Firm*—Wolf, Greenfield & Sacks, P.C.

(57) ABSTRACT

A successive approximation routine analog-to-digital converter includes a switched-capacitor circuit that samples an input voltage into a plurality of capacitors without the need for power to be dissipated by the analog-to-digital converter. A comparator, coupled to the switched-capacitor circuit, compares a voltage across the capacitors with another voltage during each of a number of iterations. A common mode voltage of the switched-capacitor circuit is boosted during at least some of the iterations. The boost may be accomplished in many different ways and may be different for each of a single-ended, a quasi-differential and fully differential versions of the analog-to-digital converter.

17 Claims, 8 Drawing Sheets

FIG. 1
PRIOR ART

FIG. 2A
PRIOR ART
Vinp = Vrefn

FIG. 2B
PRIOR ART
Vinp = Vrefp

FIG. 2C
PRIOR ART
Vinp = 3/8*Vrefp

TOP-PLATE WAVEFORMS DURING SAR FOR Vinn = Vrefn, Vcm = (VDD-VSS)/2, SAR-N = 000000

FIG. 3A PRIOR ART Vinp = GND

FIG. 3B PRIOR ART Vinp = VDD

FIG. 3C PRIOR ART Vinp = 3/8*VDD

TOP-PLATE WAVEFORMS DURING SAR FOR Vrefp = VDD, Vrefn = VSS = GND, Vinn = Vcm = GND, SAR-N = 000000

FIG. 4

FIG. 5B
Vinp = 3/8*VDD

TOP-PLATE WAVEFORMS DURING SAR FOR
Vinn = Vcm = GND, SAR-N = 000000
WITH BOOST IMPLEMENTED

FIG. 5A
Vinp = 3/8*VDD

TOP-PLATE WAVEFORMS DURING SAR FOR
Vinn = Vcm = GND, SAR-N = 000000

TOP-PLATE WAVEFORMS DURING SAR FOR Vinn=Vcm=GND

TOP-PLATE WAVEFORMS DURING SAR FOR Vcm=VDD/2

ANALOG-TO-DIGITAL CONVERTER WITH THE ABILITY TO ASYNCHRONOUSLY SAMPLE SIGNALS WITHOUT BIAS OR REFERENCE VOLTAGE POWER CONSUMPTION

TECHNICAL FIELD

The present invention relates generally to the field of analog-to-digital converters and, more particularly, to a charge redistribution analog-to-digital converter that provides for asynchronously sampling signals in a fully powered-down state of the converter.

BACKGROUND

Analog-to-digital converters (ADCs) are well-known and are in widespread use. With the recent high growth of portable electronics systems, the requirement for long lasting low power battery operated systems has become paramount. ADCs are often required to take samples of randomly occurring events and thus must be able to idle for extended periods of time until these events occur. During that time, power is dissipated as the ADC system awaits in readiness to acquire these events. Generally, this "stand-by" power is associated with a reference or bias voltage either internal or external to the ADC. In order to extend battery life, many systems will essentially completely power down and awake when the random event occurs in order to be able to sample the event. This awakening process takes time and, thus, the actual capability to capture the event's beginnings is curtailed.

There exists a need for an essentially completely powered down ADC system which can respond instantly to a sampling request.

One type of ADC is a so-called "switched-capacitor," or charge redistribution, converter in which an input voltage is sampled as charge across an array of capacitors during a first time phase. Thereafter, charge is redistributed as the converter determines a digital "equivalent" to the sampled input voltage. One well-known ADC that makes use of switched capacitor circuitry is the so-called successive approximation routine (SAR) converter.

Figure 1:
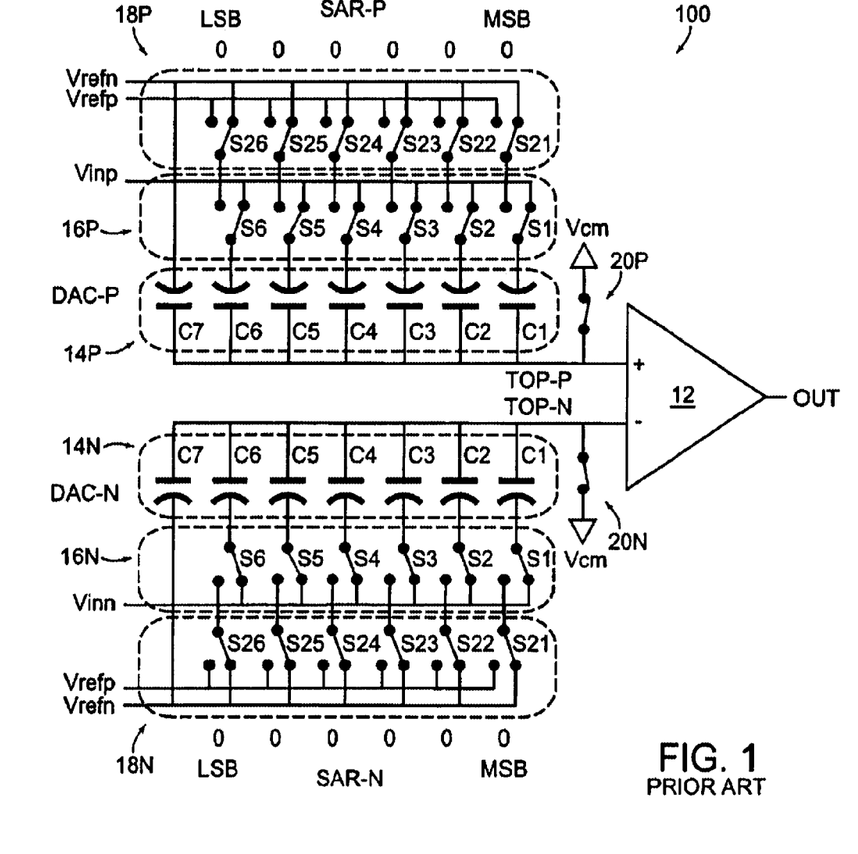
FIG. 1 is a diagram illustrating an SAR ADC.

A differential input, charge redistribution SAR ADC is shown in FIG. 1. It samples a pair of input voltages, Vinp and Vinn, with respect to a datum, or common-mode bias voltage, Vcm, and, under the control of a successive approximation routine (SAR) engine, produces a sequence of binary decisions at the output, OUT, which correspond to the digital equivalent of the input voltage difference with respect to the reference voltage difference, (Vrefp–Vrefn).

The ADC system 100 shown comprises two digital-to-analog converters (DACs), DAC-P and DAC-N, a comparator 12, and an SAR engine (not shown) to drive the DACs. Each DAC comprises (for this example) a 6-bit binary-weighted capacitor array 14P, 14N, where the total capacitance of each array 14P, 14N is C. The DACs further comprise two corresponding sets 16P, 16N of switches to connect the respective DAC inputs to Vinp/n, and corresponding sets 18P, 18N of switches to connect the respective DAC inputs to Vrefp/n, as well as switches 20P, 20N to connect the DAC outputs, TOP-P, TOP-N, to the datum or common-mode voltage point(s), Vcm.

In the example shown in FIG. 1, each of the weighted capacitor arrays 14N (associated with DAC-N) and 14P (associated with DAC-P) includes capacitors C1, C2, C3, C4, C5, C6 and C7. The capacitances of such capacitors, with respect to the total capacitance C of the array, is as follows: C1=C/2, C2=C/4, C3=C/8, C4=C/16, C5=C/32, C6=C/64 and C7=C/64. The sum of the capacitances of C1–C7 equals C.

Each of switch sets 16N (associated with DAC-N) and 16P (associated with DAC-P) includes switches S1, S2, S3, S4, S5 and S6. Each of switch sets 18N (associated with DAC-N) and 18P (associated with DAC-P) includes switches S21, S22, S23, S24, S25 and S26.

The DAC outputs TOP-P, TOP-N, provide input voltages to the comparator 12. The plates of the capacitors directly connected to the outputs TOP-P, TOP-N are referred to as the "top plates" with the other capacitor plates referred to as the "bottom plates." The switches to Vcm are referred to as the "top-plate switches" 20P, 20N.

During operation, an input voltage is sampled as charge across the input capacitors. With the DAC bottom plates connected to the input voltage Vinp and Vinn through switches 16P and 16N, when the top-plate switches 20P and 20N are closed, the DAC is said to be "sampling the input", and the instant at which the top plate switches open, the DAC is said to have "taken the sample".

After sampling the input voltage, the SAR ADC 100 carries out an iterative process, referred to as a successive approximation routine (SAR). Using the P-side of the circuit as an example, the SAR iterative process begins by connecting the bottom plate of each of the capacitor array 14P capacitors C1 . . . C6, through its corresponding switch S1 . . . S6 in switch bank 16P and a corresponding switch S21 . . . S26 in switch bank 18P, to either the positive reference voltage Vrefp or the negative reference voltage Vrefn. Each capacitor, e.g. C4, represents one of the bits in the digital output word of the ADC 100, the most significant (MSB) of which corresponds to capacitor C1 and the least significant bit (LSB) of which corresponds to capacitor C6.

In an exemplary embodiment, a bit has a binary value of 1 when the bottom plate of the associated capacitor, e.g. C4, is connected to the positive reference voltage Vrefp and the bit has a binary value of 0 when the bottom plate of the capacitor, e.g. C4, is connected to the negative reference voltage Vrefn through switch bank 18. In this example, switch S4 would get switched to connect capacitor C4 to the Vref set (not the Vinp position) and switch S24 would get aligned to connect capacitor C4 to either Vrefp or Vrefn, depending on whether C4 was to represent a logical 1 or 0, respectively.

As those skilled in the art will appreciate, through such a series of SAR iterations, starting with the MSB capacitor and ending with the LSB capacitor, wherein, during each iteration, each capacitor is switched to either Vrefp or Vrefn such that the top plate voltages, TOP-P and TOP-N, converge with each iteration. When the iterations have completed, the last-used digital word (the value of the bits to which the capacitors were connected) is selected as the output of the ADC. These iterations are graphically depicted later.

For pseudo-differential operation, Vinn (often referred to as a "ground sense") is held at a voltage near Vrefn. The ADC 100 is powered by voltage supplies of VDD (positive) and VSS (negative) and the reference voltage inputs are Vrefp and Vrefn. The DAC top plates are sampled to Vcm, which is an arbitrary but constant voltage typically mid-way between VDD and VSS. Note that during sampling, TOP-P and TOP-N will be nominally held at approximately Vcm by the top plate switches.

Figure 2A:
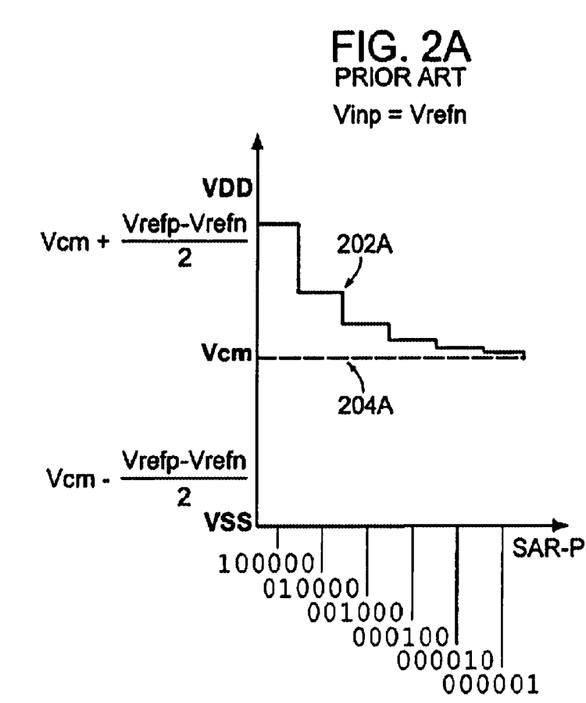
FIGS. 2A–C show voltages at nodes during operation of an SAR ADC with certain operating parameters.
Figure 2B:
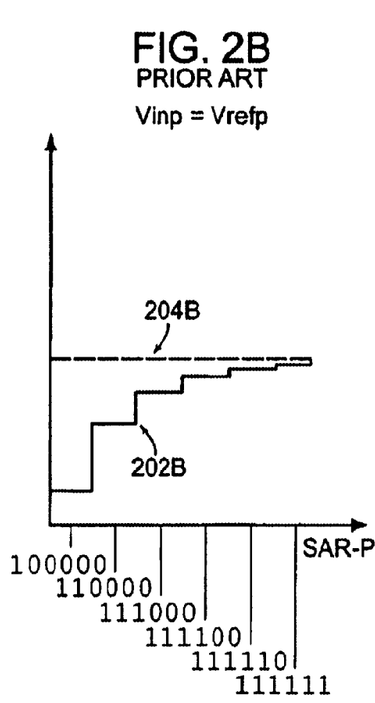
Figure 2C:
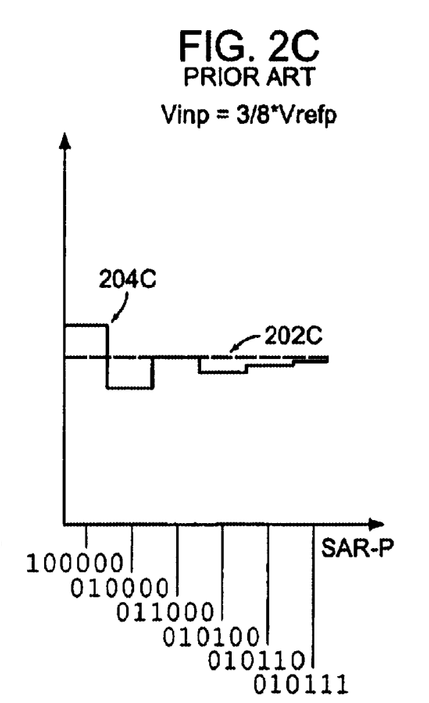

FIGS. 2A–C show an aspect of the pseudo-differential operation of the DAC 100 of FIG. 1. FIGS. 2A–C, and all subsequent similar figures, depict the top plate voltages TOP-P, TOP-N after the sample is taken and the digital words shown are presented to the SAR-P and SAR-N switches. SAR-N=000000 in FIGS. 2A–C, and SAR-P values are shown along the horizontal axis for each of a number of iterations in the SAR process.

As an example, FIG. 2A shows the output voltage 202A of TOP-P, as well as voltage 204A for TOP-N with Vinp=Vrefn. The voltage 202A decreases monotonically, and the bit sequence at SAR-P is shown along the horizontal axis, and is 100000 at the first iteration and 010000, 001000, 000100, 000010, 000001 at subsequent successive iterations of the SAR.

FIG. 2B shows an analogous situation for voltages 202B below Vcm with Vinp=Vrefp. The TOP-P voltage 202B is monotonically increasing. The SAR-P bit sequence changes from initial value 100000 to 110000, 111000, 111100, 111110, 111111 on subsequent successive iterations of the SAR.

FIG. 2C shows the situation for Vinp=⅜*Vrefp. The TOP-P voltage 202C here is not monotonic, and the SAR-P sequence is 100000, 010000, 011000, 010100, 010110, 010111.

The reader should note that, during the course of the SAR, several things occur. Firstly, the TOP-P node may undergo voltage excursions above and below the datum or common mode voltage, Vcm, as shown in FIGS. 2A–C. Secondly, the TOP-P voltage is driven by the SAR to progressively more closely approach the TOP-N voltage. This is indicated in FIGS. 2A–C, where in all three instances, voltages 202 and 204 converge after a number of steps. Thirdly, as the SAR progresses, there is a "critical decision" which may occur at any cycle (depending on the input being converted) characterized by TOP-P voltage 202 being essentially equal to TOP-N voltage 204. At this point the digital value of SAR-P represents the input voltage being converted. Fourthly, at the critical decision, the state of each of TOP-P and TOP-N is essentially the same as that when the sample was taken, i.e., both are at Vcm. The latter represents a "return-to-zero" condition whereby any system "parasitics", either linear or non-linear, and which would otherwise corrupt the conversion process, are essentially in the same state as they were during sampling and, thus, are prevented from contributing errors. It is for that reason that one strives to maintain the same value of Vcm for both sampling and conversion. Unfortunately, maintaining Vcm during sampling while awaiting a random instantaneous request to take a sample consumes some power in the ADC system.

Figure 3A:
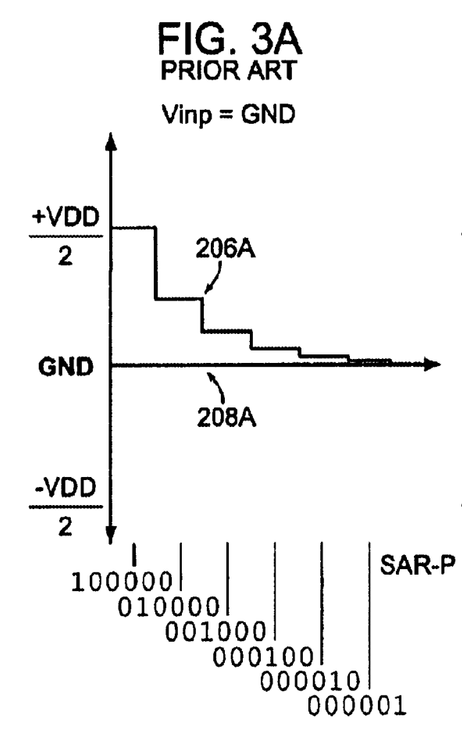
FIGS. 3A–C show voltages at nodes during operation of an SAR ADC with certain operating parameters.
Figure 3B:
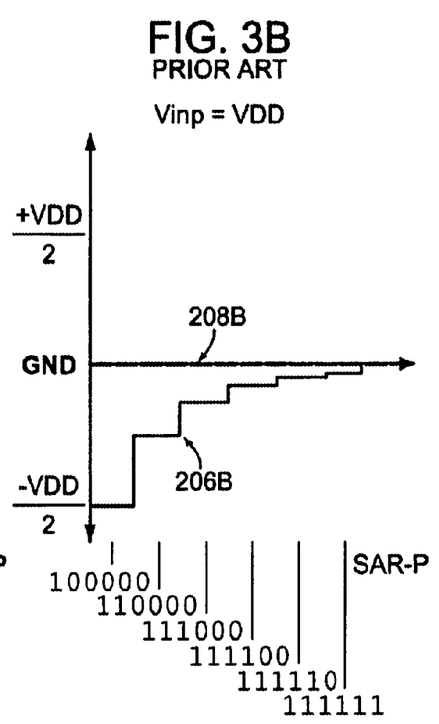
Figure 3C:
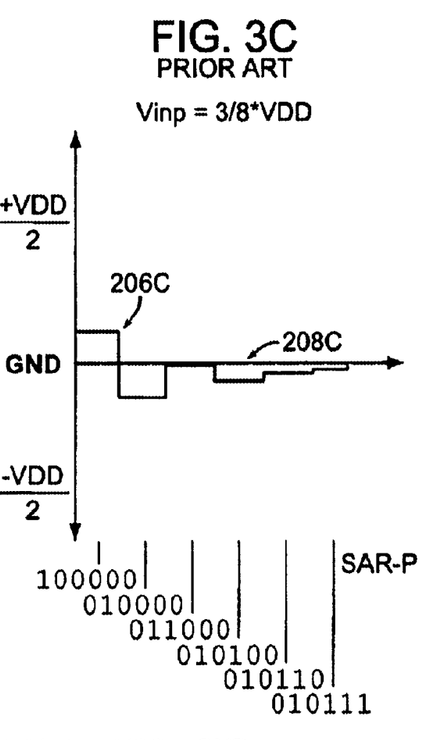

FIGS. 3A–C show an attempt to eliminate Vcm to save power for a pseudo-differential system. For simplicity, the system of FIGS. 3A–C have the following alterations with respect to FIGS. 1 and 2A–C: Vrefp=VDD, Vrefn=VSS=Vcm=GND. It is the condition of Vcm=GND (zero power required) which is being highlighted in FIGS. 3A–C. Under these conditions, TOP-P is driven to voltages below ground up to an amount of half of the power supply, VDD. In general, whenever a circuit node exceeds the power supply voltages by more than a few hundred millivolts, a parasitic diode (not shown) turns on and current flows through that diode, often with detrimental consequences. In this case, the top plate switch parasitic diode turns on and the sampled charge on the capacitor array representing the sampled input voltage starts to flow through the diode and is lost. The subsequent conversion is corrupt and the digital answer will therefore be wrong.

FIGS. 3A–C depict the top plate voltages TOP-P, TOP-N after the sample is taken and ignoring the effects of any parasitic diodes. The digital words shown are presented to the SAR-P switches during the SAR algorithm. SAR-N=000000 in FIGS. 3A–C, and SAR-P values are shown for each of a number of iterations in the SAR process.

As an example, FIG. 3A shows the output voltage 206A of TOP-P, as well as voltage 208A for TOP-N with Vinp=GND. The voltage 206A decreases monotonically, and the bit sequence of SAR-P is shown along the horizontal axis, and is 100000 at the first iteration and 010000, 001000, 000100, 000010, 000001 at subsequent successive iterations of the SAR.

FIG. 3B shows an analogous situation for voltages 206B less than ground voltage when Vinp=VDD. The TOP-P voltage 206B is monotonically increasing. The SAR-P bit sequence changes from initial value 100000 to subsequent successive values 110000, 111000, 111100, 111110, 111111 on successive iterations of the SAR.

FIG. 3C shows the situation for Vinp=⅜*Vrefp. The TOP-P voltage 202C here is not monotonic, and the SAR-P sequence is 100000, 010000, 011000, 010100, 010110, 010111.

It can be thus seen that attempting to eliminate all power sustaining Vcm by setting Vcm equal to GND will result in the turning on of any parasitic diodes present at the top plate.

SUMMARY

One aspect of the invention is to boost the inputs to the comparator after sampling the input voltage but prior to beginning the successive approximation routine (SAR). The boost should avoid the problem of turning on diodes and enabling sampled charge to escape. As the routine iteratively progresses and the voltage differences between TOP-P and TOP-N become less and less, to a point where the voltage on an output node of a digital-to-analog converter (DAC) no longer would be able to turn on a diode, then the boost to the comparator inputs is removed.

More specifically, the invention will show how it is possible to make the above configuration with Vcm=GND during acquisition, and thus having essentially zero power dissipation during acquisition, and yet still yield accurate conversions.

The invention applies to numerous different types of ADCs, not just switched-capacitor ADCs. Also, it applies to any of differential, single-ended, pseudo-differential and quasi-differential ADCs.

One embodiment of the invention is directed to an analog-to-digital converter (ADC) including a switched-capacitor circuit that samples an input voltage onto a plurality of capacitors of at least one DAC. Assuming two DACs (which is the case in the differential version of the ADC of the invention), a comparator, coupled to the switched-capacitor circuit, compares the voltage across the DACs and directs an SAR algorithm to modify the DAC inputs such that the two DAC outputs converge. The common mode output voltage of the DACs is boosted during only some of the iterations.

According to another embodiment of the invention, a method of analog-to-digital conversion includes acts of: using a comparator to compare one input with another input during each of a number of iterations; and applying a common-mode boost to the comparator during at least some of the iterations.

DETAILED DESCRIPTION

The applicants herein have discovered a technique in an integrated charge redistribution ADC which provides for the ability to sample signals with respect to much smaller than usual voltages, down to and including the negative power supply voltage. This enables the ADC to asynchronously sample in a fully powered-down state of the converter without the requirement for any powered external bias or reference voltage. This provides the ability to take a sample of a signal without having to first power up an idle circuit. The technique also can be used to sample with respect to much higher than usual voltages, up to and including the positive supply voltage.

The invention in general is directed to providing a boost in voltage, current or charge to a node or nodes in an ADC at one time period of operation to avoid voltage, current or charge loss, and then removing the boost during a later time period of operation when the risk of loss has disappeared. In doing so, accurate and efficient, in terms of power consumption, operation of the ADC can be realized. The invention can be applied to a charge redistribution (e.g., SAR) ADC or a pipelined ADC, or the like. It will be described in one embodiment with respect to a SAR ADC.

Figure 4:
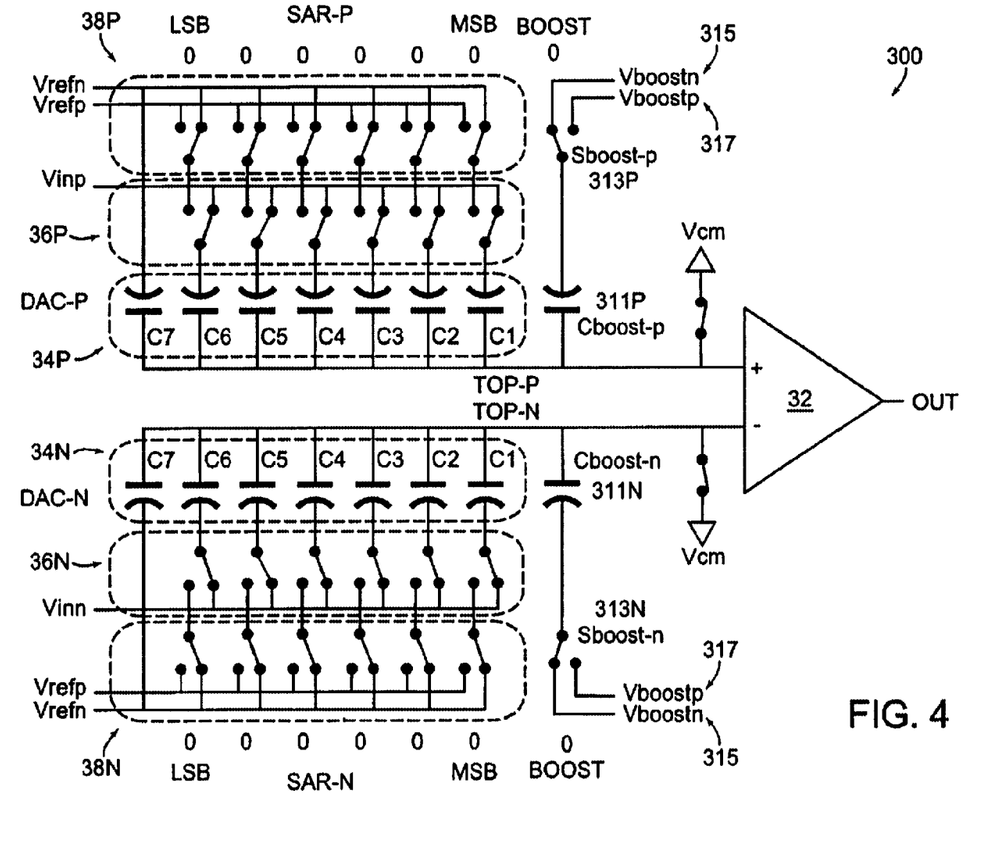
FIG. 4 is a diagram illustrating an SAR ADC according to the present invention.

FIG. 4 is a diagram illustrating one embodiment of an SAR ADC 300 according to the invention. FIG. 4 is similar to FIG. 1 with the additions of boost capacitors Cboost-P and Cboost-N and respective switches Sboost-P and Sboost-N. Each switch Sboost-P or Sboost-N can connect its corresponding capacitor Cboost-P or Cboost-N to voltage Vboost-P (referred to herein as a BOOST=1 state) or Vboost-N (referred to herein as a BOOST=0 state).

Figure 5A:
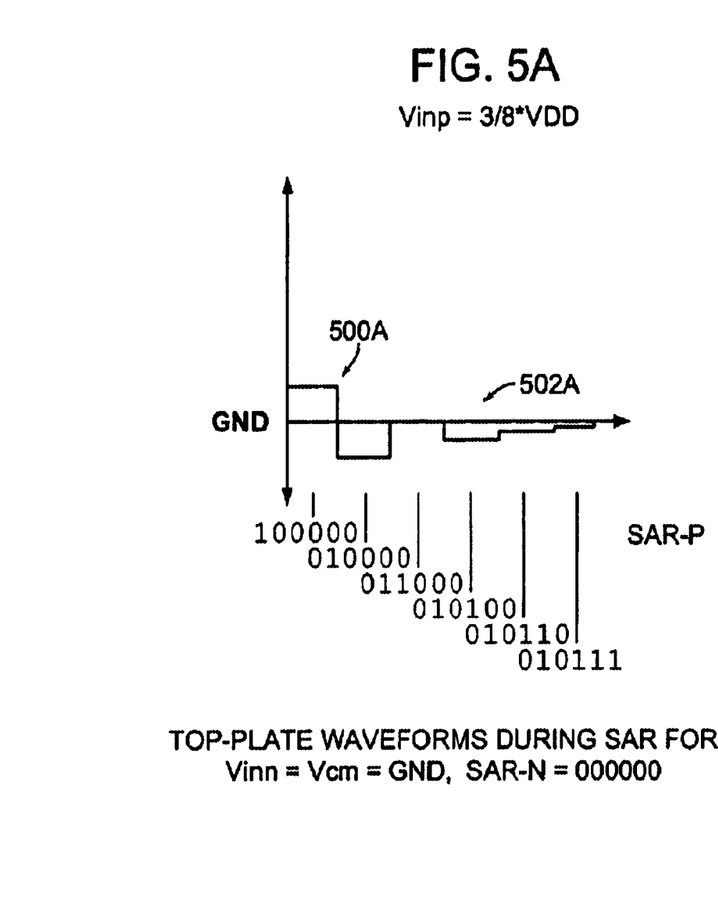
FIGS. 5A–B, 6A–C, 7A–C and 8A–C show voltages at certain nodes in an ADC according to the invention during operation with certain different operating parameters.
Figure 5B:
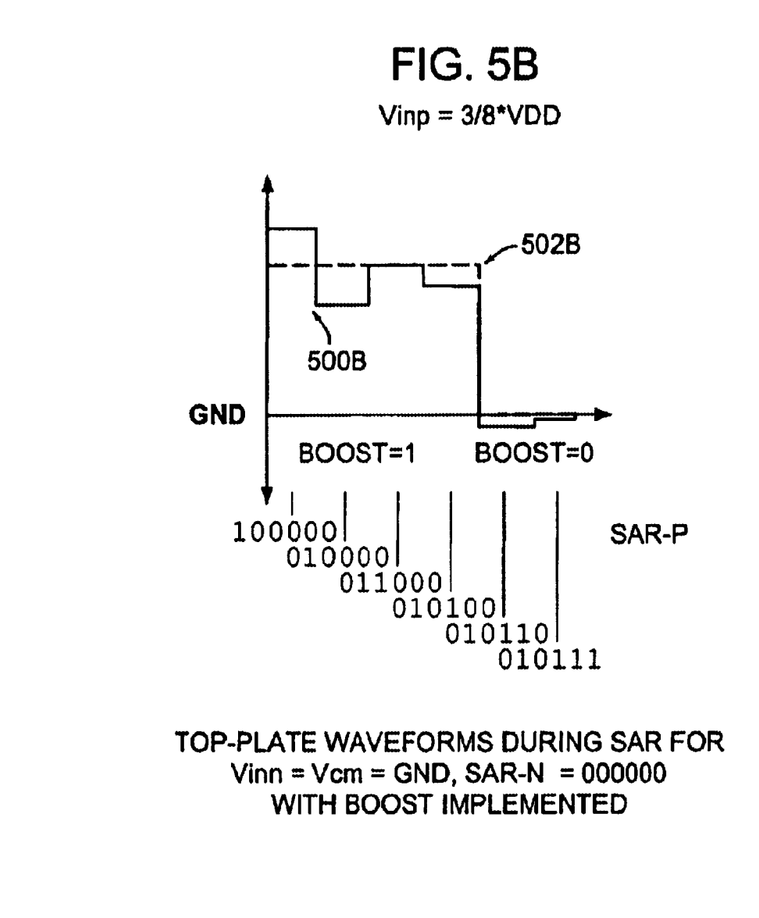

Operation of the circuit 300 of FIG. 4 is described by referring to FIGS. 5A and 5B.

FIG. 5A repeats the pseudo-differential conversion of Vinp=⅜*VDD previously shown in FIG. 3C, with voltages 500a and 502a representing values of the TOP-P and TOP-N potentials throughout the SAR process. FIG. 5A depicts the conversion using the circuit of FIG. 4 with BOOST=0 throughout the conversion. It can be seen that for the first few SAR cycles, the voltage excursions below GND of TOP-P would indeed have caused parasitic diodes on TOP-P to turn on and yield an undesirable charge loss. However, as the SAR progresses, the voltage excursions below ground become smaller and smaller, and the peak extent of such excursions can be determined.

One aspect of the present invention involves switching switches Sboost-N and Sboost-P to achieve a BOOST=1 state after the sample is taken and thus shift both TOP-P and TOP-N sufficiently such that no detrimental voltage excursions below GND are possible while in the BOOST=1 state. After a deterministic number of SAR cycles, the maximum negative excursion of TOP-P below TOP-N can be shown to be no more than a few hundred millivolts (typically less than 400 mV), not enough to turn on a parasitic diode. At this point, the boost is removed (i.e., return to a BOOST=0 state), and the SAR may complete as usual without the parasitic diodes turning on and losing charge on the capacitor arrays 34P, 34N. This operation is depicted in FIG. 5B.

It should be appreciated that the amount of voltage boost need not be limited to the positive reference voltage, but can be any amount of voltage that would prevent a parasitic diode from turning on and enabling sampled charge to escape. Also, as mentioned, the boost may be in the form of voltage, charge, current, or other, so long as it results in a condition where it prevents a parasitic diode from turning on and dissipating charge. Also, while a differential circuit is shown, in which the ADC includes two DACs, each having its own boost capacitor, the invention is not so limited and, as mentioned, can apply to single-ended, quasi-differential and pseudo-differential circuits.

A reason that the common mode voltage is boosted and then removed is that the boosting in and of itself may create an error. If more than one boosting capacitor is used, for example, such as in a pseudo-differential circuit arrangement, the capacitance of each of the boosting capacitors may not be exactly equal. This difference may introduce an offset voltage to the system. Thus, after a certain number of SAR iterations, because the voltage difference, e.g., 100 millivolts, is not enough to turn on the diode, boost to the common mode voltage is removed, thereby removing any offset error that may have been introduced in the first place. In addition, after the common mode voltage is boosted, some of the sampled input voltage charge is transferred to any parasitic capacitors existing at the output node of the DAC, i.e., at the top plate of each of capacitors in the DAC array. When the boosted voltage is returned to ground, the parasitic charge returns to the input capacitors.

The technique just described, while not losing charge to forward biased diodes formed during top plate voltage excursions below ground, does suffer from errors associated with the non-linear parasitics and comparator common mode issues at a possible critical decision during the boost period. Fortunately, after the BOOST=0 state, the error correction technique of SAR redundancy can be applied to fully recover that error. The redundancy technique creates yet another critical decision, but this time that critical decision will occur with the top plate conditions being the same as those during sampling. Error correction techniques involving redundancy are well-known in the art and are described, for example, in K. Bacrania, 'Digital Error Correction to Increase Speed of Successive Approximation', IEEE ISSCC Vol. 29, pp 140–141, February 1986 and the subsequent U.S. patent 'Method for Successive Approximation A/D Conversion' by Cooper et al., U.S. Pat. No. 4,620,179 Oct. 28, 1986, which are herein incorporated by reference in their entirety.

As a result, an ADC system incorporating this invention can use Vcm=GND and, thus, the power dissipation required to generate Vcm can be reduced to zero.

The circuit of FIG. 4 is one of many ways to achieve the boost required to avoid the problems described in the Background section herein where a parasitic diode is turned on. In fact, the circuit of FIG. 1 can also be used to achieve this boost by simply modifying the SAR algorithm.

Figures 6A, 6B:
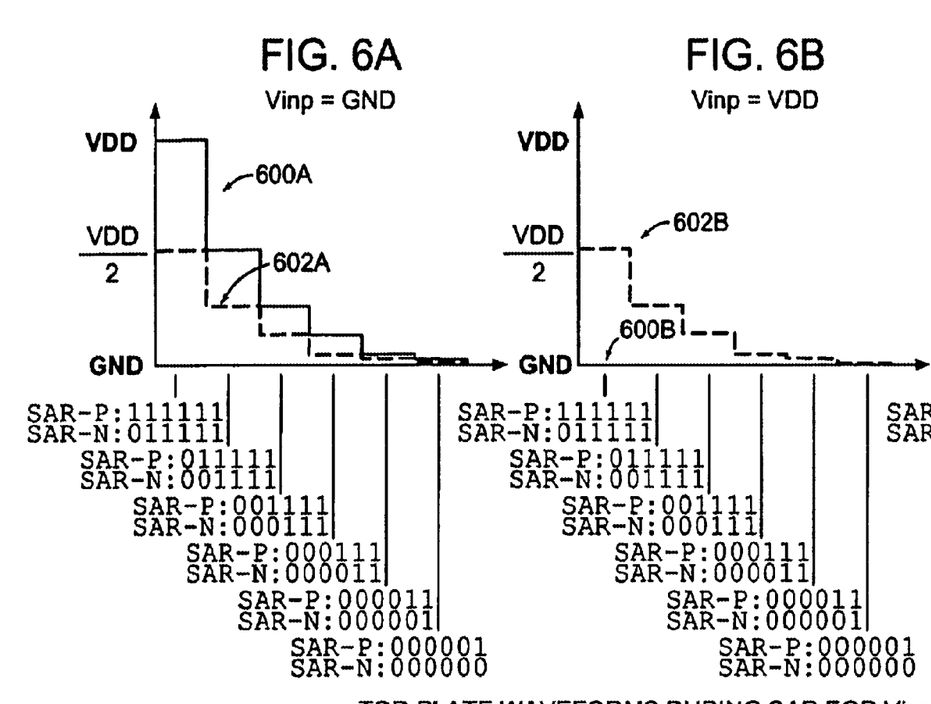
Figure 6C:
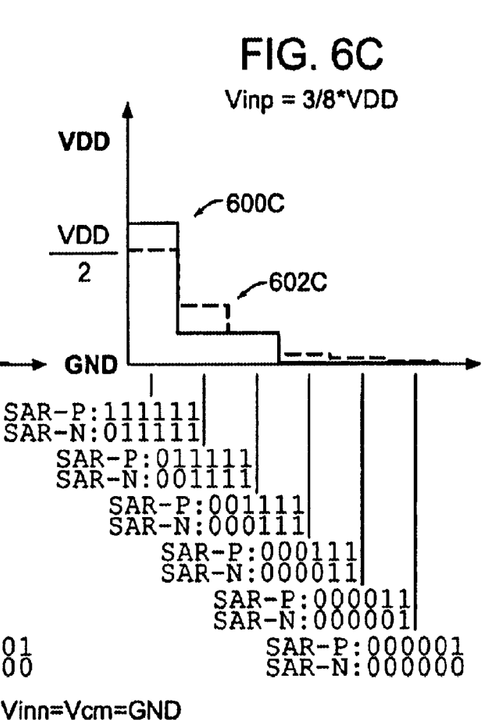

FIG. 6 depicts the same conversions as that shown in FIG. 3, with the exception that SAR-N is also involved in the modified SAR algorithm. Once the sample is taken, TOP-P 600 and TOP-N 602 can be boosted by VDD/2 simply by connecting half of the capacitor arrays, 34P, 34N to Vref= VDD. For SAR-P, this means starting with 111111 instead of 100000, and for SAR-N, starting with 011111 instead of 000000. Note that SAR-N could also have been equivalently set to 100000. The resultant top plate voltages maintain their original differential value, but have their common mode voltage shifted by VDD/2. The comparator 12 will make its decision, A, and the next SAR-P will become A 11111, which corresponds to A10000 of the conventional SAR routine but boosted to A11111. To compensate, the circuit simply equalizes the boost on the SAR-N to 001111 i.e., the proper differential voltage is maintained again, but this time the boost is VDD/4. By following FIG. 6, it should be appreciated that the differential input to the comparator 12 is similar to the conventional algorithm but that the common mode to the comparator 12 is also reducing towards zero as the modified SAR progresses.

FIG. 6A shows the case where Vinp=GND and TOP-P voltage 600a is initially VDD, while TOP-N voltage 602a is initially VDD/2. The voltages converge, with both voltages 600a and 602a decreasing monotonically.

FIG. 6B shows the case where Vinp=VDD and TOP-P voltage 600b is kept equal to GND. TOP-N voltage 602b decreases monotonically from VDD/2 to converge at GND.

FIG. 6C shows the case where Vinp=⅜*VDD. Again, both TOP-P voltage 600c and TOP-N voltage 602c decrease monotonically toward GND.

As was the case with the fixed boost example of FIGS. 4 and 5A–C, this technique also includes potentially critical decisions relating to common mode voltages significantly different to the Vcm=GND situation during sampling. One of many solutions is to remove the boost from both sides when the differential top plate voltages TOP-P, TOP-N are small enough to not forward bias any top plate parasitic diodes and then invoke one or more SAR redundant bits. For this example, removing the boost from both sides means reverting back to the conventional SAR algorithm whereby SAR-N=000000. However, it is possible to maintain the modified SAR algorithm throughout the entire conversion if the last redundant bit occurred in the presence of an acceptably small residual common mode voltage.

It should be noted that this technique can use several alternate SAR algorithms to achieve the same effect and the above is but one of these. The invention is not so limited to any one algorithm or implementation.

Figure 7A:
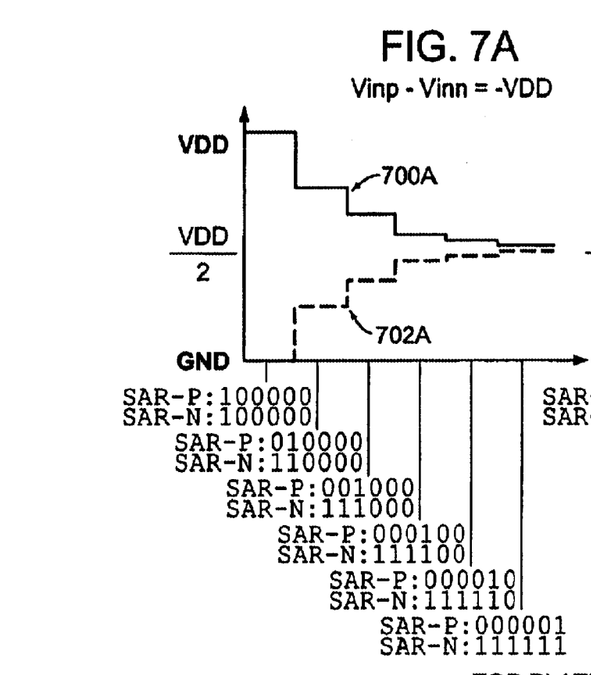
Figures 7B, 7C:
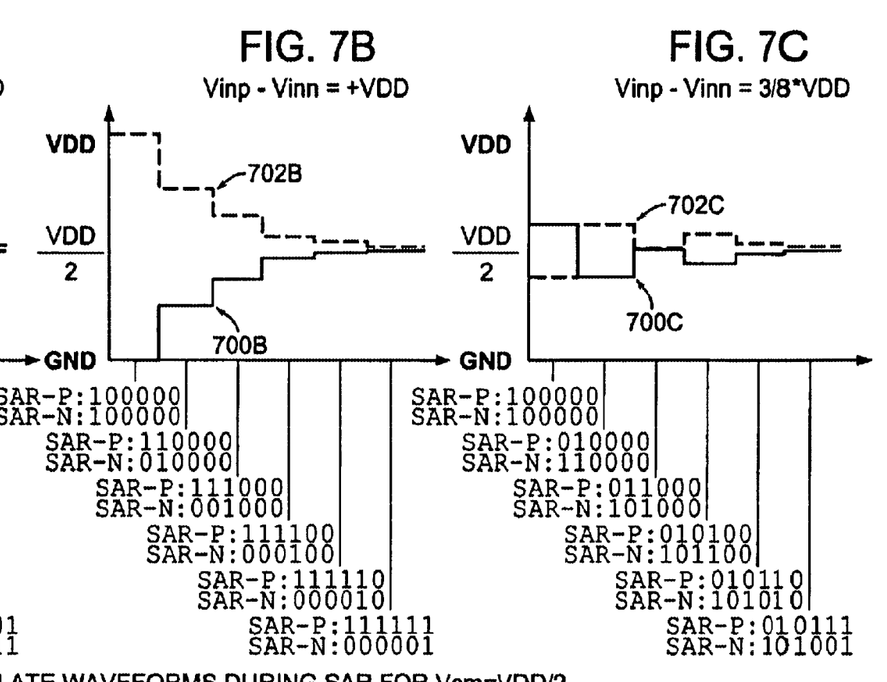

This technique also works with differential circuits in the same manner. The circuits of FIGS. 1 and 4 may still be used for this purpose. For example, consider FIG. 1 with the previous conditions of Vrefp=VDD and Vrefn=GND converting "rail-to-rail" input voltages between VDD and GND on each of Vinp and Vinn. Prior art circuits would have worked using Vcm approximately equal to VDD/2 and converted voltages according to the conventional SAR algorithm depicted in FIGS. 7A–C. Again, these ADC systems would have dissipated power maintaining Vcm during acquisition. The solution to sampling with Vcm=GND is to again modify the SAR algorithm. FIGS. 7A–C show the top-plate waveforms during a conventional SAR for Vcm=VDD/2.

FIG. 7A shows TOP-P voltage 700a and TOP-N voltage 702a starting at values of VDD and GND respectively and converging at a value near VDD/2 at the beginning of the SAR.

Here Vinp−Vinn=−VDD.

FIG. 7B shows TOP-P voltage 700b and TOP-N voltage 702b also converging as in the previous figure. However, with initial values of voltages 700a and 700b equal to GND and VDD respectively, and with Vinp−Vinn=+VDD.

FIG. 7C again shows the TOP-P and TOP-N voltages 700c and 702c respectively oscillating about and converging onto a value of VDD/2. Here Vinp−Vinn=⅜*VDD.

Figures 8A, 8B, 8C:
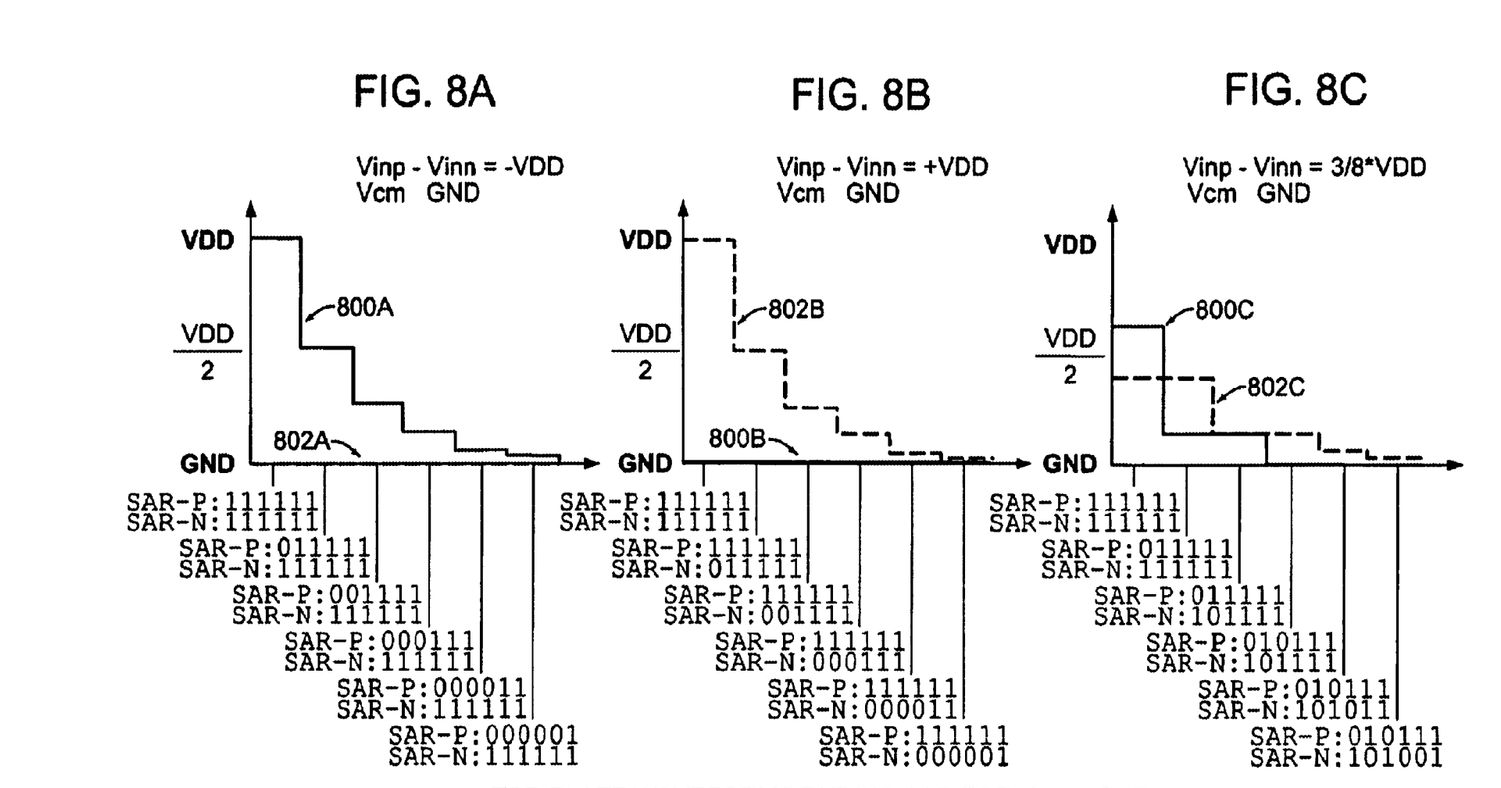

FIGS. 8A–C show the same conversion results as FIGS. 7A–C with Vcm=GND and a modified SAR algorithm. For differential inputs, either Vinp or Vinn may be between VDD and GND. In order to guarantee that neither TOP-P nor TOP-N goes below ground when the SAR is setup for the first comparison, both SAR-P and SAR-N must be set to 111111. This maintains the original difference between Vinp and Vinn on TOP-P and TOP-N, but now the SAR algorithm must change to lower only the higher of TOP-P or TOP-N (unlike the pseudo-differential case which lowered both of TOP-P and TOP-N). At each SAR cycle, this "leap-frog" algorithm causes the higher of TOP-P and TOP-N to step down while leaving the other alone. As with the previous cases, critical decisions may occur at top plate voltages significantly above Vcm=GND and the same solutions apply e.g., reverting to a conventional SAR algorithm with Vcm=GND once the maximum difference between TOP-P and TOP-N is small enough to not forward bias any parasitic diodes on the top plate and then apply one or more SAR redundant bits.

FIG. 8A shows the case for Vcm=GND, VINP=GND, VINN=VDD and VINP−VINN=−VDD. TOP-P voltage 800a starts at VDD and TOP-N voltage 802a starts at GND. The voltage 800a decreases monotonically to GND.

FIG. 8B shows the case Vcm=GND, VINP=VDD, VINN=GND and VINP−VINN=+VDD. TOP-P starts at a voltage 800b=GND and TOP-N starts at a voltage 802b=VDD. The voltage 800b remains at GND and the voltage 802b decreases monotonically to GND also.

FIG. 8C shows the case Vcm=GND, VINP=11/16*VDD, VINN=5/16*VDD and VINP−VINN=+⅜*VDD. TOP-P voltage 800c starts at about VDD/2 and decreases monotonically to GND, and TOP-N voltage 802c also starts near VDD/2 and decreases monotonically to GND.

Whichever DAC has a larger voltage at a particular iteration, the common mode voltage of that DAC is reduced by an MSB (one-half of the voltage) of the current iteration in preparation for the next iteration. Following this process, the common mode voltage converges towards ground.

Such a technique does introduce a source of error such that if a critical decision occurs while an offset is in place, then that decision was made while charge was lost in top plate parasitic capacitances charged by the offset voltage. To overcome such offset error, as discussed, one or more SAR redundant bits are used after the offset is removed.

Thus, one aspect is the use of error correction such as redundancy to recover from a known and intentionally introduced disturbance, such as a voltage or current or charge, into a system, such as, but not limited to, a charge distribution system, e.g., a switched-capacitor SAR ADC.

As described, it should be appreciated that the invention also provides a way to asynchronously sample with the top plate of input capacitors in DAC(s) of an ADC connected to one of the power supply voltages of the ADC itself rather than to some powered biased voltage. A correspondingly inverted modified SAR algorithm would then be used. This also enables the ADC to operate, and sample an input voltage, in a fully powered-down state.

The embodiments exemplified herein have thus far referred to differential-type structures whereby the differential inputs to a comparator have been boosted via a DACP and DACN. In some cases, converters are described as 'single-ended' or as having a single input. In such cases, the input signal must still be measured with respect to some other signal, such as a 'ground' node. The ADC actually converts the voltage differential between these two nodes to arrive at the digital representation of the signal. Because it is a difference voltage that is converted, similar structures for the converters are used, and similar methods are applied as in converters that are explicitly designed for differential circuits. It is possible to use a single ended circuit without a differential DAC, however to use the techniques herein a differential boost must still be provided. For circuits such as this, the boosting must be provided to or within the comparator, such as boosting the reference node of the comparator or boosting the threshold voltage of the comparator. The term 'differential' is thus intended to generally encompass all the usual differential representations (such as pseudo-differential, quasi-differential, fully differential) as well as single-ended representations.

It should be appreciated that while the invention was described with respect to SAR ADCs, the invention is not so limited. It may, for example, alternatively be applied to other ADC architectures as readily will be appreciated to those skilled in the art after a reading of the present application.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto.

What is claimed is:

1. An analog-to-digital converter comprising:
   a comparator that receives first and second inputs and compares the first input with the second input during each of a number of iterations;
   wherein the first and second inputs of the comparator receive a common-mode boost during at least some of the iterations.

2. The analog-to-digital converter as claimed in claim 1 wherein the received common-mode boost is independent of a difference between the first and second inputs.

3. An analog-to-digital converter as claimed in claim 1 wherein each of the first and second inputs of the comparator is coupled to a different boost circuit.

4. The analog-to-digital converter as claimed in claim 3 wherein at least one of the boost circuits is a switched capacitor circuit.

5. The analog-to-digital converter as claimed in claim 4 wherein at least one of the boost circuits is a digital-to-analog converter.

6. The analog-to-digital converter as claimed in any of claims 2, 3, 4 or 5 wherein the analog-to-digital converter includes an error correction capability.

7. The analog-to-digital converter as claimed in claim 5 wherein the analog-to-digital converter includes a successive approximation routine analog-to-digital converter.

8. The analog-to-digital converter as claimed in claim 5 wherein the digital-to-analog converter is a switched-capacitor circuit comprising a plurality of capacitors, with at least one of those capacitors being used to sample an input with respect to a datum.

9. The analog-to-digital converter as claimed in claim 8 wherein the analog-to-digital converter receives power supply voltages including ground and power, and wherein the datum is approximately equal to one of the power supply voltages.

10. A method of analog-to-digital conversion including acts of: using a comparator to compare one input with another input during each of a number of iterations; and applying a common-mode boost to the inputs to the comparator during at least some of the iterations.

11. The method of analog-to-digital conversion as claimed in claim 10 wherein the applied common-mode boost is independent of a difference between each input.

12. The method of analog-to-digital conversion as claimed in claim 10 further including an act of reducing or removing the common-mode boost during at least some of the iterations.

13. The method of analog-to-digital conversion as claimed in claim 10 wherein each input of the comparator is coupled to a digital-to-analog converter, and wherein the act of applying includes the digital-to-analog converters applying the common-mode boost to the comparator during at least some of the iterations.

14. The method of analog-to-digital conversion as claimed in claim 13 wherein the act of applying further includes the digital-to-analog converters converging the common-mode boost to the comparator towards zero for at least some of the iterations.

15. The method of analog-to-digital conversion as claimed in claim 14 further including an act of the digital-to-analog converters converging the inputs to the comparator towards zero for at least some of the iterations.

16. The method of analog-to-digital conversion as claimed in any of claims 10, 13 or 14 further including an act of error correction during at least some of the iterations.

17. The method of analog-to-digital conversion as claimed in claim 14, including implementing a successive approximation routine during at last some of the iterations.

* * * * *